US006894627B2

(12) United States Patent
Janakiraman et al.

(10) Patent No.: US 6,894,627 B2
(45) Date of Patent: May 17, 2005

(54) INCREASING THE SNR OF SUCCESSIVE APPROXIMATION TYPE ADCS WITHOUT COMPROMISING THROUGHPUT PERFORMANCE SUBSTANTIALLY

(75) Inventors: Seetharaman Janakiraman, Bangalore (IN); Kiran Manohar Godbole, Bangalore (IN); Surendranath Nagesh, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/663,729

(22) Filed: Sep. 17, 2003

(65) Prior Publication Data

US 2005/0057387 A1 Mar. 17, 2005

(51) Int. Cl.[7] ................................................ H03M 7/20
(52) U.S. Cl. ...................................... 341/102; 341/118
(58) Field of Search ................................ 341/118, 120, 341/102, 143, 156

(56) References Cited

U.S. PATENT DOCUMENTS

| 4,308,524 | A | | 12/1981 | Harrison et al. | |
|---|---|---|---|---|---|
| 5,266,952 | A | | 11/1993 | Stone et al. | |
| 5,675,340 | A | * | 10/1997 | Hester et al. | 341/156 |
| 5,684,487 | A | | 11/1997 | Timko | |
| 6,313,769 | B1 | * | 11/2001 | Mangahas et al. | 341/118 |
| 6,326,912 | B1 | * | 12/2001 | Fujimori | 341/143 |
| 6,351,231 | B1 | | 2/2002 | Price et al. | |
| 6,400,302 | B1 | | 6/2002 | Amazeen et al. | |
| 6,486,806 | B1 | | 11/2002 | Munoz et al. | |
| 6,538,588 | B1 | * | 3/2003 | Bazarjani | 341/143 |
| 6,559,789 | B1 | | 5/2003 | Somayajula | |
| 6,600,437 | B1 | | 7/2003 | Confalonieri et al. | |
| 2003/0123646 | A1 | | 7/2003 | Srinivasan et al. | |

OTHER PUBLICATIONS

Hadidi KH et al. "Error Analysis and Digital Correction Algorithms for Pipelined A/D Converters". Proceedings of the International Symposium on Circuits and Systems. New Orleans, May 1–3, 1990, New York, IEEE, US, vol. vol. 3 CONF. 23, May 1, 1990, pp. 1709–1712, XP000163547 "figure 4".

* cited by examiner

Primary Examiner—Michael Tokar
Assistant Examiner—Joseph Lauture
(74) Attorney, Agent, or Firm—W. Daniel Swayze, Jr.; W. James Brady; Frederick J. Telecky, Jr.

(57) ABSTRACT

When converting an analog signal to N-bit digital codes, high SNR (signal to noise ratio) by generating multiple N-bit codes from the same analog sample and averaging the N-bit codes. However, the entire N-bit code is determined only a single time, and only P-bit (P less than N) codes are generated. The P-bit codes may be averaged, and the N-bit code is corrected based on the average value to generate an accurate N-bit digital code. As P can be much less than N, the correction can be implemented in a few iterations, thereby enabling the ADCs to be implemented with a high throughput performance. Due to the correction, a high SNR may be attained as well.

31 Claims, 10 Drawing Sheets

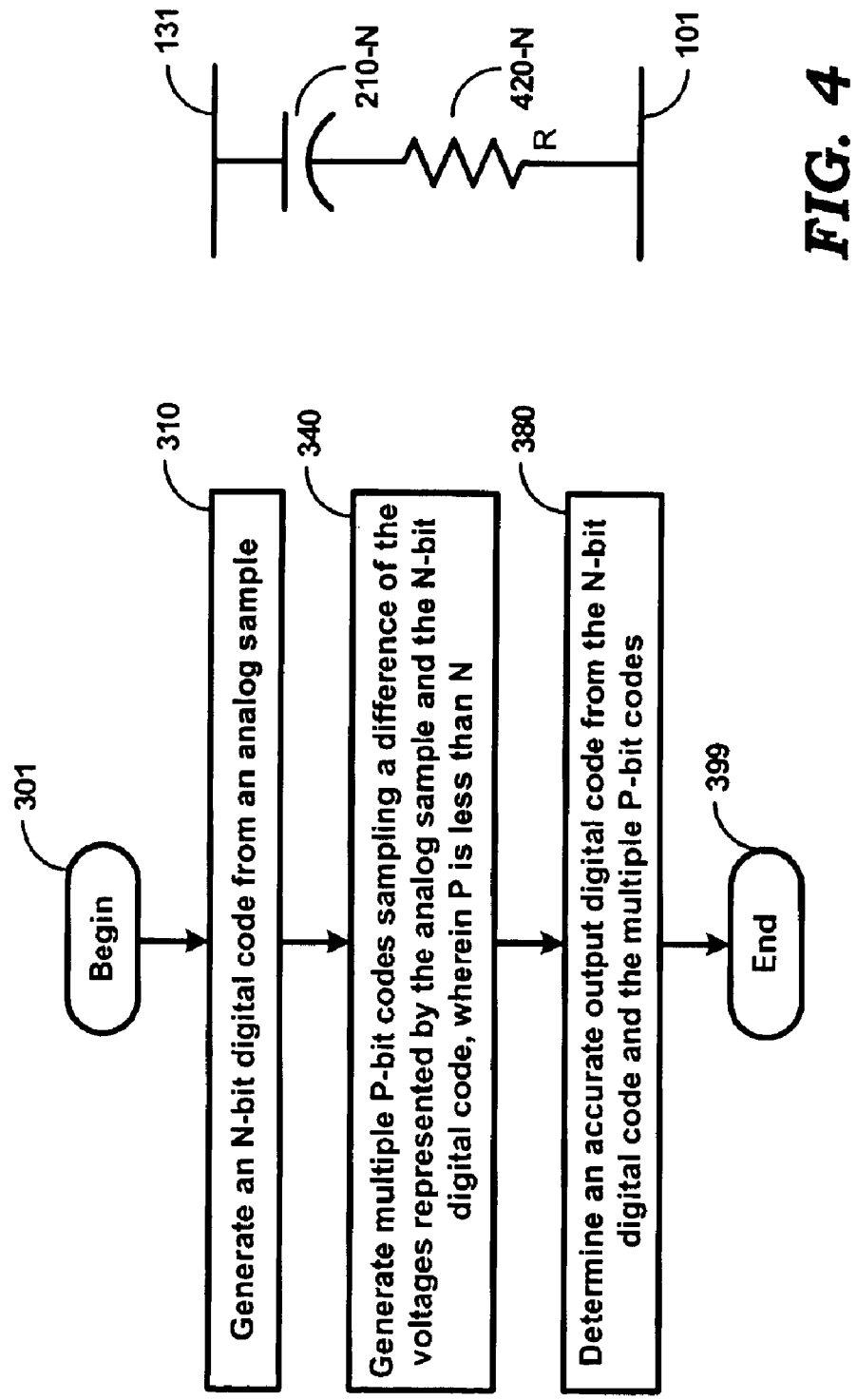

INCREASING THE SNR OF SUCCESSIVE APPROXIMATION TYPE ADCS WITHOUT COMPROMISING THROUGHPUT PERFORMANCE SUBSTANTIALLY

BACKGROUND OF THE INVENTION

1. Field of the Invention

The present invention relates to the design of analog to digital converters (ADCs), and more specifically to a method and apparatus for increasing the signal to noise ratio (SNR) performance of successive approximation type analog to digital converters (ADCs) without compromising throughput performance substantially

2. Related Art

Analog to digital converters (ADCs) are used to generate a sequence of digital codes representing the signal level of an analog signal as is well known in the relevant art. ADCs often employ successive approximation principle (SAP) for such a conversion. ADCs implemented using SAP are generally referred to as SAR (successive approximation register) ADCs as a register is used to store the codes used to generate an intermediate analog signal.

In a typical SAP based implementation, each bit of a digital code (with the digital code representing a sample of the analog signal) is determined in a single iteration, starting from the most significant bit. To determine the most significant bit, the most significant bit is set to a specific logical value (e.g., 1) and the following bits to the other logical value (0), and the resulting number is converted to the intermediate analog signal (generally using a digital to analog converter (DAC), contained in the ADC). Assuming the specific logical value equals 1, the value of the most significant bit of the digital code is determined to equal 0 if the sample of the analog signal has less voltage than the intermediate analog signal, or else to 1. The next significant bit may be set to 1 (while setting the most significant bit to the determined value) and the following bits to 0, and the resulting number is used to generate a new intermediate analog signal.

The new intermediate analog signal is compared with the sample of the analog signal to determine the corresponding (next significant) bit of the digital code. The approach is continued until all the bits of the digital code are determined. Other digital codes representing an analog signal may be generated at a desired sampling interval.

One parameter of general interest in relation to ADCs is signal-to-noise-ratio (SNR). A high SNR generally implies that the generated digital codes are less susceptible to noise, and a low SNR implies that the digital codes would vary with the noise. Accordingly, a high SNR is generally desirable in several environments.

One source of such noise is the noise components introduced by various components (e.g., transistors) which implement the SAP approach. Such introduced noise is often random in nature, and it is desirable to generate digital codes which are not affected by such noise.

In one prior approach of increasing SNR, multiple temporary codes are generated from a portion of an input analog signal representing the same digital code, and the multiple temporary codes are averaged to generate the digital code. The averaging generally effectively reduces the noise components, as is well known in the relevant arts.

One problem with such an approach is that the throughput of the ADC may be reduced due to the generation of multiple temporary codes. Throughput generally refers to the number of digital codes provided at the output of an ADC. For example, if an ADC converts analog signal at a rate of 1 MSPS (Mega samples per second) and two temporary codes are averaged to generate a single digital code, the throughput of the ADC may be reduced to 500 KSPS (Kilo samples per second).

By using more number of temporary codes to generate each digital code, the SNR of an ADC can be increased further. However, the throughput of the ADC may be reduced by a factor equaling the number of temporary codes used. Such degradation in throughput performance may be undesirable, at least in some environments. What is therefore needed is a method and apparatus to provide high SNR without substantially reducing throughput performance of successive approximation type ADCs.

SUMMARY OF THE INVENTION

A successive approximation type analog to digital converter (SAR ADC) according to an aspect of the present invention converts a sample of an input analog signal into an accurate N-bit digital code. In an embodiment, the SAR ADC contains a comparator which provides a comparison result of a first analog signal and said sample. A digital to analog converter (DAC) receives an intermediate N-bit value and an intermediate P-bit value, and DAC generates the first analog signal based on the intermediate N-bit value and the intermediate P-bit value.

A SAR logic determines a first N-bit digital code according to successive approximation principle (SAP) by sending the intermediate N-bit value in each of N iterations. The SAR logic then generates a first P-bit digital code according to SAP by sending the intermediate P-bit value in each of P iterations. The first N-bit digital code is corrected using the first P-bit digital code to generate an accurate N-bit digital code representing the sample.

It may be appreciated that the P-bit digital code represents the difference voltage of the sample and the voltage represented by the N-bit digital code. Such difference voltage in turn may reflect the noise introduced internally in the SAR ADC during operation. By correcting the N-bit digital code, the signal-to-noise-ratio (SNR) is enhanced. By using fewer than N-bits to correct the N-bit value, the decrease in throughput performance is minimized. The SNR of the ADC may be enhanced further by generating multiple of the P-bit digital codes, and correcting the first N-bit value according to an average value of all the P-bit codes.

Further features and advantages of the invention, as well as the structure and operation of various embodiments of the invention, are described in detail below with reference to the accompanying drawings. In the drawings, like reference numbers generally indicate identical, functionally similar, and/or structurally similar elements. The drawing in which an element first appears is indicated by the leftmost digit(s) in the corresponding reference number.

BRIEF DESCRIPTION OF THE DRAWINGS

The present invention will be described with reference to the following accompanying drawings briefly described below.

FIG. (FIG.)1 is a block diagram illustrating the details of an example embodiment of a successive approximation analog to digital converter (SAR ADC).

FIG. 3 is a flow chart illustrating a method using which the reduction of throughput performance may be minimized while improving the SNR at the output of the SAR ADC according to an aspect of the present invention.

FIG. 4 is a circuit diagram illustrating the details of noise generated by a switch connecting to a capacitor contained in a SAR ADC.

DETAILED DESCRIPTION OF THE PREFERRED EMBODIMENTS

1. Overview

An aspect of the present invention improves the SNR of a SAR ADC while reducing the decrease in throughput performance (compared to prior approach(es) noted in sections above). In an embodiment, the SAR ADC converts a sample of an analog signal into an N-bit digital code. The ADC then generates multiple P-bit codes (wherein P is less than N) sampling a difference of the voltages represented by the sample of the analog signal and the N-bit digital code. The ADC determines an accurate digital code by averaging the multiple P-bit codes and adding the resulting average to the N-bit digital code. In addition, the average may also be used to correct the N-bit digital code in either positive and negative directions.

As may be readily appreciated, averaging would increase the SNR of the ADC, and using only P-bit codes (rather than N-bit codes) would reduce the decrease in throughput performance. Thus, ADCs providing high SNR as well as high throughput performance may be provided using various aspects of the present invention.

Several aspects of the invention are described below with reference to examples for illustration. It should be understood that numerous specific details, relationships, and methods are set forth to provide a full understanding of the invention. One skilled in the relevant art, however, will readily recognize that the invention can be practiced without one or more of the specific details, or with other methods, etc. In other instances, well-known structures or operations are not shown in detail to avoid obscuring the invention.

2. SAR ADC

Figure 1:
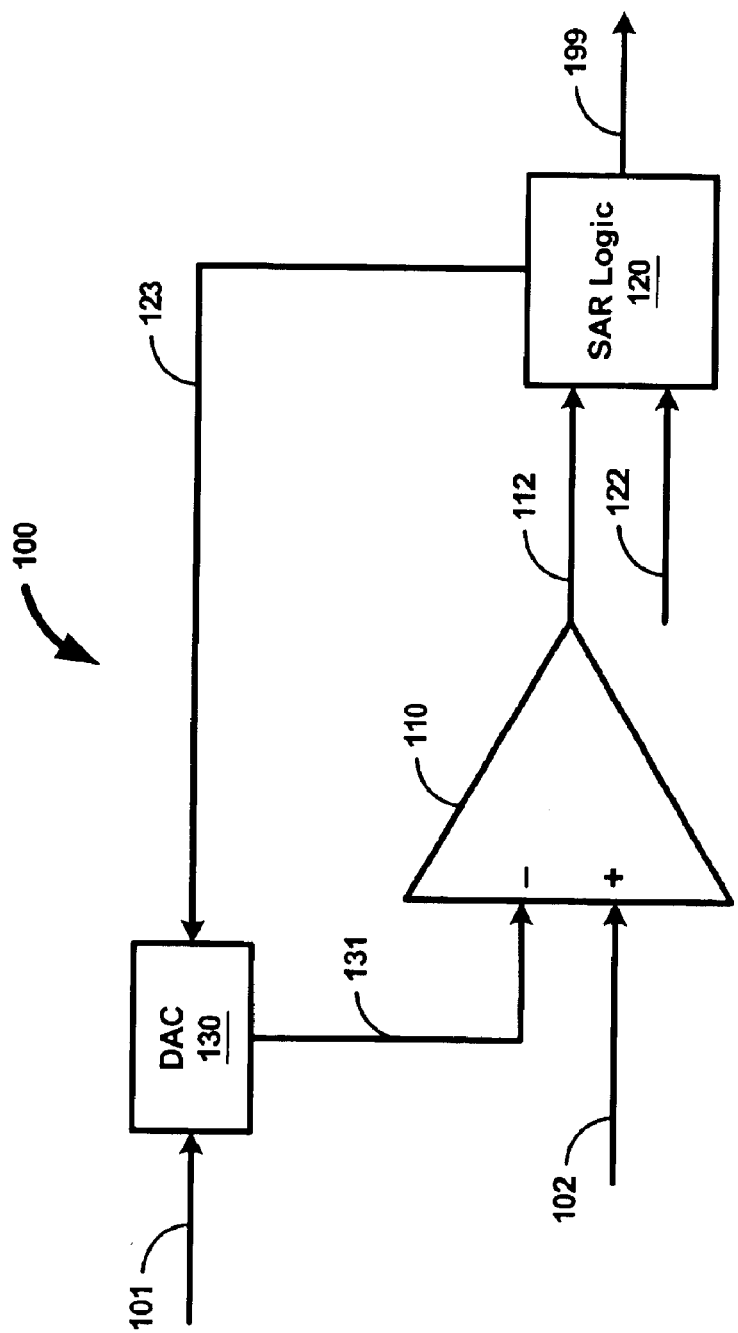

FIG. 1 is a block diagram illustrating the details of an example embodiment of SAR ADC 100 in which several aspects of the present invention can be implemented. SAR ADC 100 is shown containing comparator 110, SAR logic 120, digital to analog converter (DAC) 130. Each component is described in detail below.

Comparator 110 compares an intermediate analog signal on path 131 with a voltage level ($V_{mid}$ equaling Vdd/2) on path 102, and provides the result of the comparison (iteration status) on path 112. In an embodiment, the result equals a logical value '1' if a sample of an analog signal on path 101 is greater than the signal value corresponding to the intermediate digital value (described below), else the result equals a logical value of '0'. Comparator 110 can be implemented in known way.

DAC 130 samples the analog signal received on path 101 before the first iteration. DAC 130 then generates intermediate analog signal 131 having a voltage level equaling ($V_{mid}-V_{inp}$+a voltage level corresponding to an intermediate digital value received on path 123) in each iteration (in which a bit of the digital code is determined), wherein $V_{inp}$ represents the voltage level of the sampled analog signal.

SAR logic 120 determines the digital code corresponding to a sample (provided on path 101) using successive approximation principle by interfacing with comparator 110 and DAC 130. In general, SAR logic 120 sends an intermediate digital value during each iteration to determine a bit, and generates the digital code based on the determined bits. The digital code is provided on path 199. Clock 122 controls the duration of each iteration.

An aspect of the present invention enables the digital code to be determined quickly while maintaining a high SNR. Such a feature is achieved by implementing both SAR logic 120 and DAC 130 consistent with the principles underlying the present invention. The principles may become clearer by understanding operation of the DAC and SAR logic in example prior embodiments. Accordingly, the operation of prior DAC and SAR logic combination is described first with reference to FIGS. 2A and 2B.

3. Prior DAC

Figure 2A:
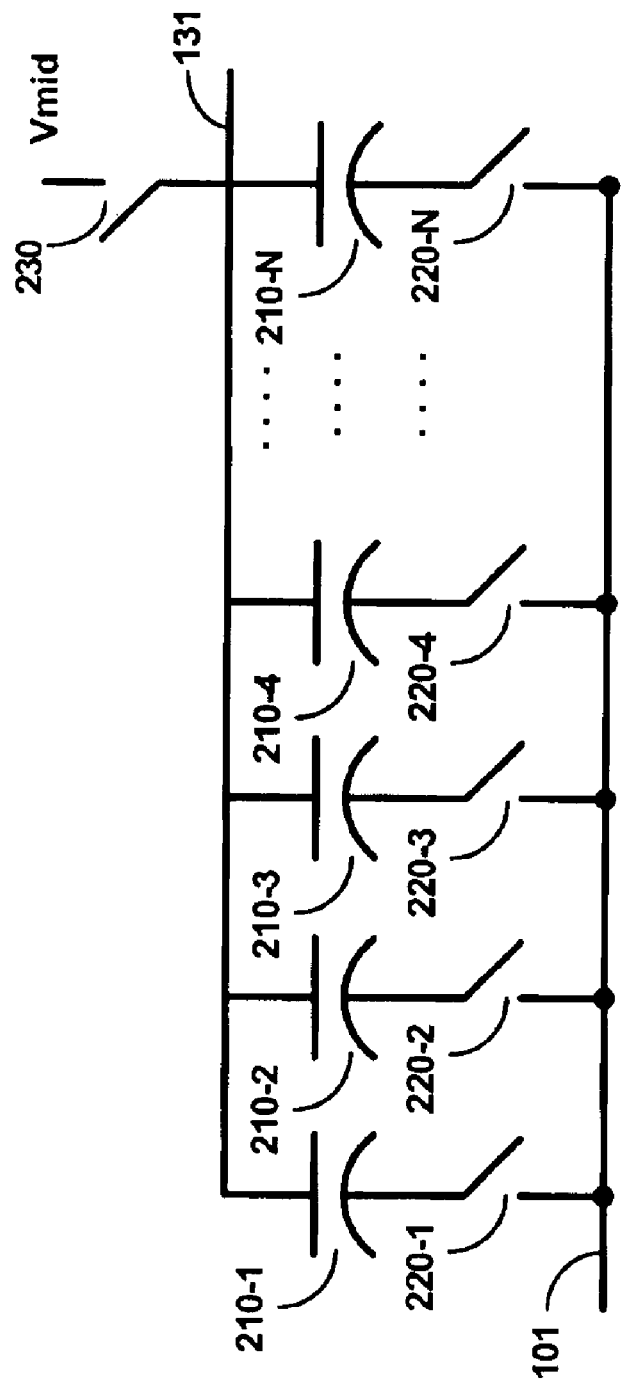
FIG. 2A is a circuit diagram illustrating the details of operation of a SAR ADC in a sampling phase.
Figure 2B:
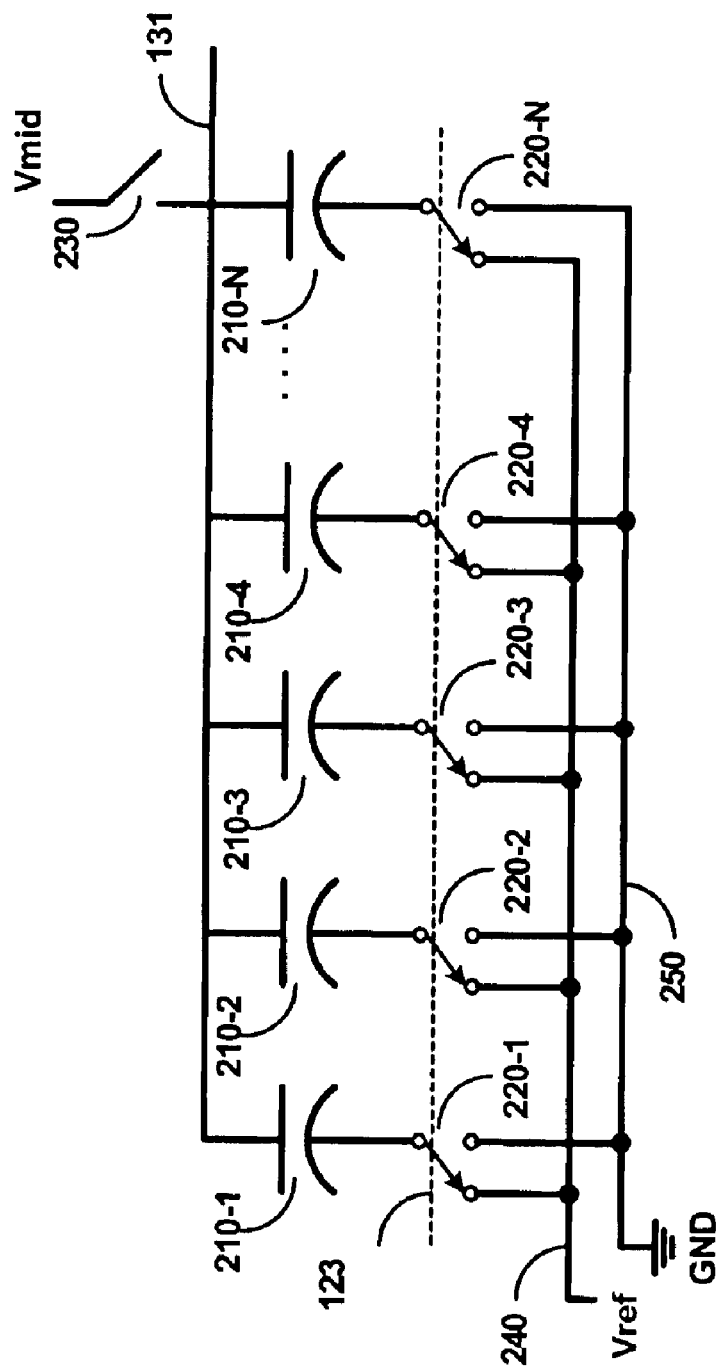
FIG. 2B is a circuit diagram illustrating the details of a SAR ADC in a conversion phase.

FIGS. 2A and 2B are circuit diagrams illustrating the details of a DAC (illustrated with reference to paths 101, 123 and 131) in sampling phase and conversion phase respectively in one prior embodiment. As is well known, the input signal (on path 101) is sampled in the sampling phase, and the sample is converted into a digital code in multiple iterations (with one bit determined in each iteration) of the conversion phase.

Continuing with reference to FIG. 2A, the DAC is shown containing capacitors 210-1 through 210-N, and switches 220-1 through 220-N and 230. Switches 220-1 through 220-N and 230 are closed in the sampling phase, causing the analog signal on path 101 to be sampled on the capacitors. One end of all the capacitors (top plate) is connected to $V_{mid}$ on path 102 and the other end (bottom plate) of each capacitor is connected to a sample of analog signal on path 101 by a corresponding switch. Capacitors 210-1 through 210-N charges through sample 101 and $V_{mid}$ 102. The total charge on capacitors represents the sample of the analog signal on path 101, which is given by equation (1):

$$Q_c = \sum_{i=1}^{N} C_i * (V_{mid} - V_{inp}) \qquad \text{Equation (1)}$$

wherein $C_i$ is the capacitance of the $i^{th}$ capacitor, N is the number of capacitors, $V_{inp}$ is the voltage level of the sample, and '*' represents a multiplication operator. The DAC is then operated in the conversion phase as described below with reference to FIG. 2B.

FIG. 2B is a circuit diagram illustrating the details of the DAC (of FIG. 2A) in the conversion phase. During conversion phase, switch 230 is opened such that the total charge on top plates of the capacitors remains at $Q_c$ (of Equation 1, above). The bottom plates of the capacitors are either connected to $V_{ref}$ on path 240 or ground on path 250 by switches 220-1 through 220-N based on the respective bits of the intermediate digital value.

If the voltage on bottom plates of the capacitors is changed, the voltage on top plates would also change in a similar manner to maintain the charge at $Q_c$. Due to the operation of switches 220-1 through 220-N, the voltage on bottom plates of the capacitors is controlled by the intermediate digital value on path 123. Therefore, a change in intermediate digital value causes a similar change in the voltage at top plates ($V_{top}$) on path 131.

Such a change may be used by a SAR logic to determine the digital code corresponding to the sample received on path 101. The operation of an embodiment of prior SAR logic is described below in further detail.

4. Prior SAR Logic

The SAR logic determines each bit of a N-bit digital code in a corresponding iteration based on a comparison result generated by comparator 110. The comparison result in turn is at one logical value if a difference voltage ($V_{diff}$) at the input of comparator 110 is positive and another logical value otherwise. Accordingly, to understand the operation of the SAR logic, it is helpful to quantify Vdiff. Thus, the manner in which $V_{diff}$ may be quantified is described below first with reference to Equations (2)–(6), and the manner in which the SAR logic determines the bits of the digital code is described next based on the Equations.

As described above, the charge at top plates remains at ($Q_c$) in conversion phase. If the voltage on bottom plates of the capacitors is changed, the voltage on top plates would also change in a similar manner to maintain the charge at $Q_c$. For example, if bottom plate of capacitor 210-N (with a capacitance of $C_N$) is connected to $V_{ref}$ on path 240 through switch 220-N and all other capacitors are connected to ground on path 250, then the charge ($Q_N$) on path 131 is given by equation (2).

$$Q_N = C_N * (V_{top} - V_{ref}) + \sum_{i=1}^{N-1} C_i * (V_{top}) \qquad \text{Equation (2)}$$

Since the charge on top plates of the capacitors is constant ($Q_c$ equals $Q_N$) for any intermediate digital value 123 and solving equations (1) and (2) would result in the voltage at top plate ($V_{top}$) as given by equation (3).

$$V_{top} = V_{mid} - V_{inp} + \frac{C_N * (V_{ref})}{\sum_{i=1}^{N} C_i} \qquad \text{Equation (3)}$$

If the bottom plate of another capacitor 210-3 (with a capacitance of C3) is also connected to $V_{ref}$ on path 240 through switch 220-3, then $V_{top}$ is given by equation (4).

$$V_{top} = V_{mid} - V_{inp} + \frac{C_N * (V_{ref})}{\sum_{i=1}^{N} C_i} + \frac{C_3 * (V_{ref})}{\sum_{i=1}^{N} C_i} \qquad \text{Equation (4)}$$

It may be observed from the above that the voltage at top plate ($V_{top}$) is proportional to the voltage at bottom plate ($V_{ref}$). Hence, if capacitances of the capacitors are binary weighted, $V_{top}$ would also change binary weighted for equal changes in the voltages at the bottom plates. Therefore, capacitances of capacitors 210-1 through 210-N are designed to equal C, 2C, 4C, through $2^{N-1}$C respectively to generate the intermediate analog signal in increments of binary weighted in each step. Accordingly, the voltage at top plate on path 131 is given by equation (5).

$$V_{top} = V_{mid} - V_{inp} + \sum_{i=1}^{N} b_i \frac{V_{ref}}{2^i} \qquad \text{Equation (5)}$$

wherein $b_i$ represent the bits in the intermediate digital value, with $b_1$ being the most significant bit (MSB) and $b_N$ being the least significant bit (LSB) and $b_1$ to $b_N$ controls switches 220-N through 220-1 respectively. As ($V_{mid}-V_{inp}$) does not change during the conversion phase, it may be appreciated from Equation (5) that the voltage at top plate on path 131 represents the intermediate digital value.

Comparator 110 is shown receiving voltages $V_{top}$ and $V_{mid}$ respectively on paths 131 and 102, and hence the difference ($V_{diff}$) (equaling ($V_{mid}-V_{top}$)) between the voltages at the input of comparator 110 is given by equation (6) as follows:

$$V_{diff} = V_{inp} - \sum_{i=1}^{N} b_i \frac{V_{ref}}{2^i} \qquad \text{Equation (6)}$$

Comparator 110 compares whether $V_{diff}$ is greater than 0 or not and provides the result of the comparison as output on path 112. In an embodiment, the result equals a logical value '1' if $V_{diff}$ is greater than 0, else the result equals a logical value of '0'. The manner in which the prior SAR logic determines each bit in the digital code using the comparison result is described below.

The prior SAR logic initially sets the MSB of the intermediate digital value to 1 and all other bits to 0 to determine the MSB. The difference voltage (from equation (6)) corresponding to such an intermediate digital value 100 . . . 0 is given by equation (7).

$$V_{diff} = V_{inp} - \frac{V_{ref}}{2} \qquad \text{Equation (7)}$$

Comparator 110 provides the comparison result of $V_{diff}$ in equation (7) on path 112. If a comparison result of 1 is received, $V_{inp}$ is greater than $V_{ref}/2$, and the SAR logic determines MSB to be '1'. Similarly, to determine $K^{th}$ bit in the intermediate digital value, the SAR logic initially sets the $K^{th}$ bit to be 1 and determines the $K^{th}$ bit based on the corresponding comparison result. If the comparison result is 1, the SAR logic determines the $K^{th}$ bit to be 1, else the SAR logic determines the $K^{th}$ bit to be 0. The SAR logic determines all the bits in an N-bit digital code in a similar manner.

However, one or more of the bits in the N-bit digital code may be determined erroneously due to various noise components. As noted above in the background section, the effect of the noise may be minimized by averaging multiple digital codes generated potentially from the same sample. However, generating all bits of each digital code may reduce the throughput performance of an ADC to an unacceptably low level. An aspect of the present invention minimizes such reduction as described below in further detail with reference to FIG. 3.

5. Method

FIG. 3 is a flow chart illustrating a method using which the throughput may be increased while providing a high SNR at the output of a SAR ADC according to an aspect of the present invention. The method is described with reference to the systems of FIGS. 1, 2A, and 2B for illustration. Various aspects of the invention can be implemented in other environments as well. The method begins in step 301, in which control immediately passes to step 310.

In step 310, SAR ADC 100 generates a N-bit digital code from an analog sample received on path 101. SAR ADC 100 may convert the analog sample into the N-bit digital code based on the successive approximation principle as described above.

In step 340, SAR ADC 100 generates multiple P-bit codes sampling a difference of voltages represented by the analog sample and the N-bit digital code, wherein P is less than N. The N-bit digital code may not precisely represent the analog sample due to varying noise levels introduced into the aggregate sampled signal, and hence the difference voltage varies at the input of comparator 110 for a fixed value of the N-bits determined in step 310. Therefore, SAR ADC 100 generates multiple P-bit codes sampling the difference voltage at different time points, each P-bit code is different due to randomness in the noise.

In step 380, SAR ADC 100 determines an accurate output digital code from the N-bit digital code and the multiple P-bit codes. In an embodiment, the accurate output digital code is determined by adding the average of the multiple P-bit codes to the N-bit digital code. In addition, in one embodiment, the P-bit codes correct the N-bit digital code only in the positive direction. However, in an alternative embodiment (also described below), the P-bit codes can be implemented to perform correction in both positive and negative directions. The method then ends in step 399.

As fewer than N-bits (i.e., P-bits) are determined multiple times, the throughput performance of an ADC may not be reduced substantially. In addition, each set of P-bits accurately reflect the error component introduced during the corresponding time of determination (of the P-bits and the prior N-bits), and thus the final digital code may be substantially independent of the noise components introduced during conversion.

As may be appreciated from the above, a designer of an ADC may need to determine the value of P. P is generally determined by the extent of noise introduced, and the desired noise tolerance level (SNR). Accordingly, the sources of noise during the analog to digital conversion are briefly described below.

7. Sources of Noise

Figure 5:
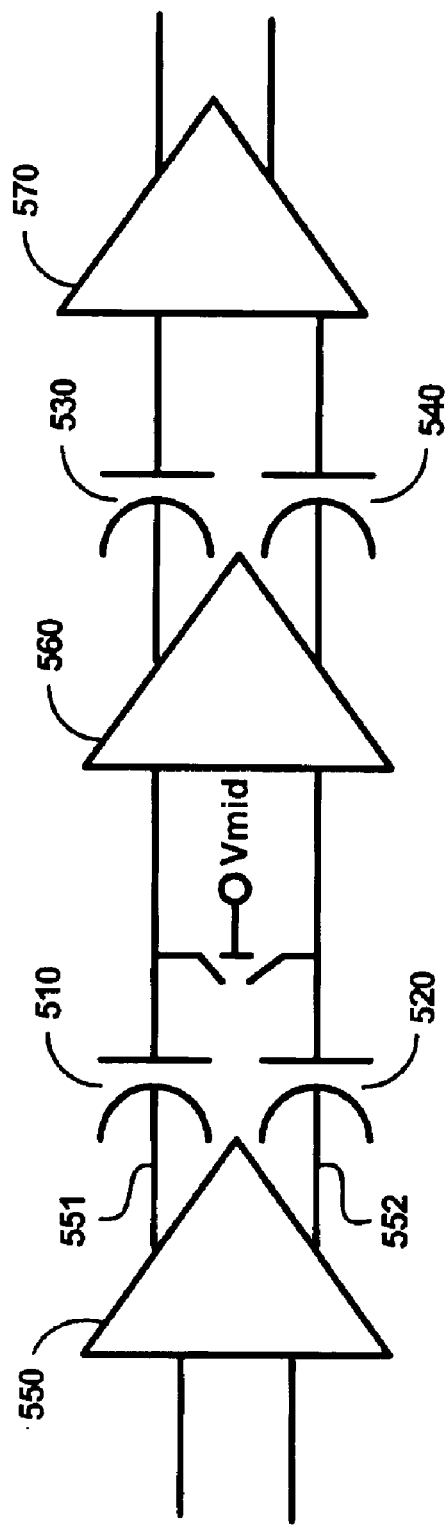
FIGS. 5 and 6 are circuit diagrams together illustrating the details of noise sources in a comparator.
Figure 6:
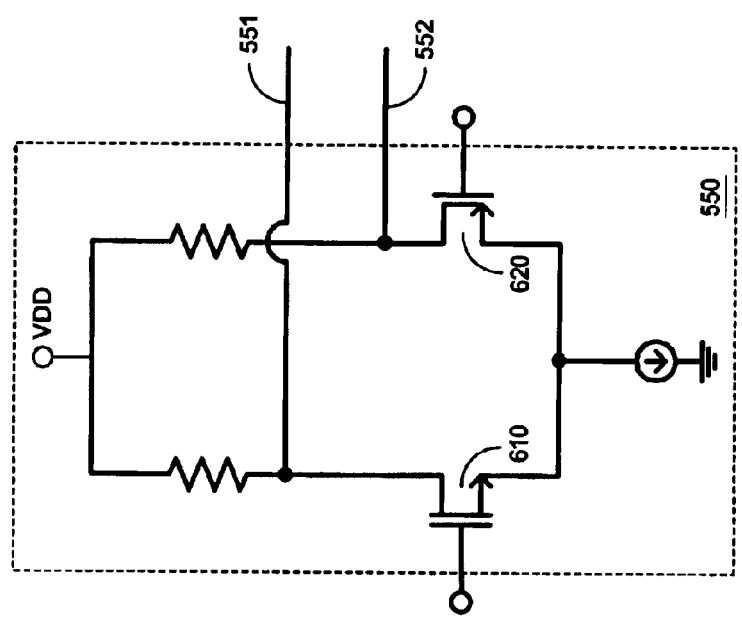

FIGS. 4, 5, and 6 illustrate the respective noise sources in a SAR ADC in an embodiment of the present invention. For illustration, the noise sources are described with reference to FIGS. 1, 2A, and 2B. Broadly, the noise components are introduced due to capacitors (210-1 through 210-N), comparator 110 (because of active elements and offset storage capacitors), Vref on path 240, and quantization noise, etc. Each noise component is described below in further detail.

FIG. 4 is a circuit diagram illustrating the manner in which the noise introduced by a switch (e.g., 220-N) connected to a capacitor, can be modeled. As is well known, a switch may be represented as a resistor. Thus, capacitor 210-N is shown connected to resistor 420-N (representing the impedance of the switch 220-N). As described above, DAC 130 is shown containing capacitors 210-1 through 210-N, which are connected to switches 220-1 through 220-N respectively, which may cause KT/C noise, wherein K is Boltzmann's constant, T is temperature in Kelvin, and C is the capacitance value of the capacitor. Therefore, each capacitor switch combination in DAC 130 may cause a noise quantified by KT/C.

FIGS. 5 and 6 are circuit diagrams together illustrating the details of noise sources in comparator 110. Comparator 110 may be implemented using multiple operational amplifiers (550, 560, and 570) connected in sequence with offset capacitors (510, 520, 530, and 540) as shown in FIG. 5. For example, operational amplifier 550 is shown connected to offset capacitors 510 and 520 on respective paths 551 and 552. Each operational amplifier may be implemented using a current source, multiple transistors (610, 620) and resistors as shown with detailed diagram for operational amplifier 550 in FIG. 6.

As may be appreciated, the off set capacitors are used to balance the imperfections in manufacture of active elements (i.e., transistors 610 and 620) in the operational amplifiers. The offset capacitors may cause KT/C noise (noted above) and the active elements may cause thermal noise, which can be quantified in a known way based on the manufacturing process used, voltages and temperature. Such noises generally reduce the SNR of SAR ADCs.

Once such sources of noises are identified and quantified, the value of P (noted in step 340 of FIG. 3 above) and the number (Q) of P-bit codes to generate may be computed as described below.

7. Determining P and Q

The number of bits required in a P-bit code and the number of P-bit codes to be generated to reduce the noise depends on the design parameters of various components in a SAR ADC. For example, the KT/C noise due to sampling capacitors in DAC 130 depends on capacitances of the capacitors and the temperature at which the device is operated. The noise due to various sources is determined based on the design paramieters.

Assuming that the variances of noises determined due to Z-noise sources are represented by $\sigma 1^2, \sigma 2^2, \ldots \sigma Z^2$, the effective variance ($\sigma tot$) is determined by square root of the sum of the squares of each variance. $\sigma tot$ is given by equation (8) and the average of the variances in given by equation (9) below.

$$\sigma tot = sqrt\left(\sum_{j=1}^{Z} \sigma_j^2\right) \quad \text{Equation (8)}$$

$$\sigma avg^2 = \frac{\sigma tot^2}{Z} \quad \text{Equation (9)}$$

wherein sqrt represents square root and * is multiplication operator. Assuming that all noises are with same variance $\sigma$, then the average variance is given by equation (10).

$$\sigma avg = \sigma/\sqrt{Z} \quad (10)$$

Therefore, it may be observed from the above that the over all noise will be reduced by $\sqrt{Z}$ times by using Z number (i.e., Q) of digital codes. A designer may compute a based on the description provided above, and Z may be computed depending on the desired SNR. The value of P may then be determined based on the characteristics of the noise. In an embodiment, the noise follows Guassian distribution. The manner in which such property can be used in determining P is described below.

Figure 7:
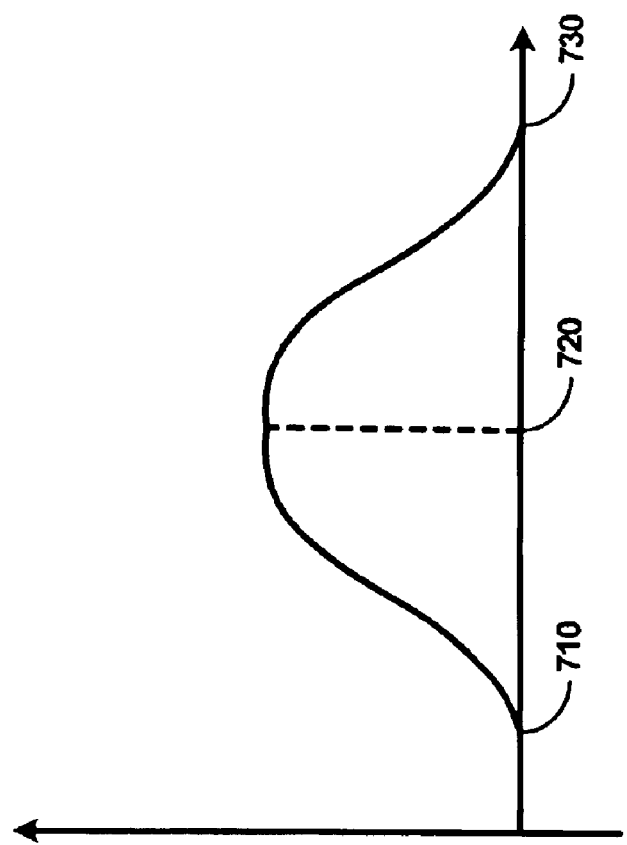
FIG. 7 is a graph illustrating the general spread of converted values in the presence of noise in SAR ADC.

FIG. 7 is a graph containing the digital codes (which may be generated upon converting the same analog sample along with the instantaneous noise introduced) on the X-axis and the expected frequency of occurrence on Y-axis. As is well known in the relevant arts, points 710, 720 and 730 indicates the values of $\mu-3$ $\sigma tot$, $\mu$ and $\mu+3$ $\sigma tot$, where $\mu$ indicates the accurate error free value sought to be eventually generated.

From the above analysis, it may be appreciated the range of values sought to be captured will have a total spread of 6 $\sigma tot$. The number of bits (P) in a P-bit code is given by equation (11).

$$P = \text{Ceiling}[\log_2(6*\sigma tot)] \quad \text{Equation (11)}$$

wherein the ceiling operation is used to round-off the result of log operation to the next biggest integer if the result of log operation is a non-integer.

It should be appreciated that number of bits lower than P can be used to attain lower SNR. The manner in which a DAC and a SAR logic may be implemented using the values of P and Q thus computed is described below with examples.

8. Capacitor DAC

Figure 8:
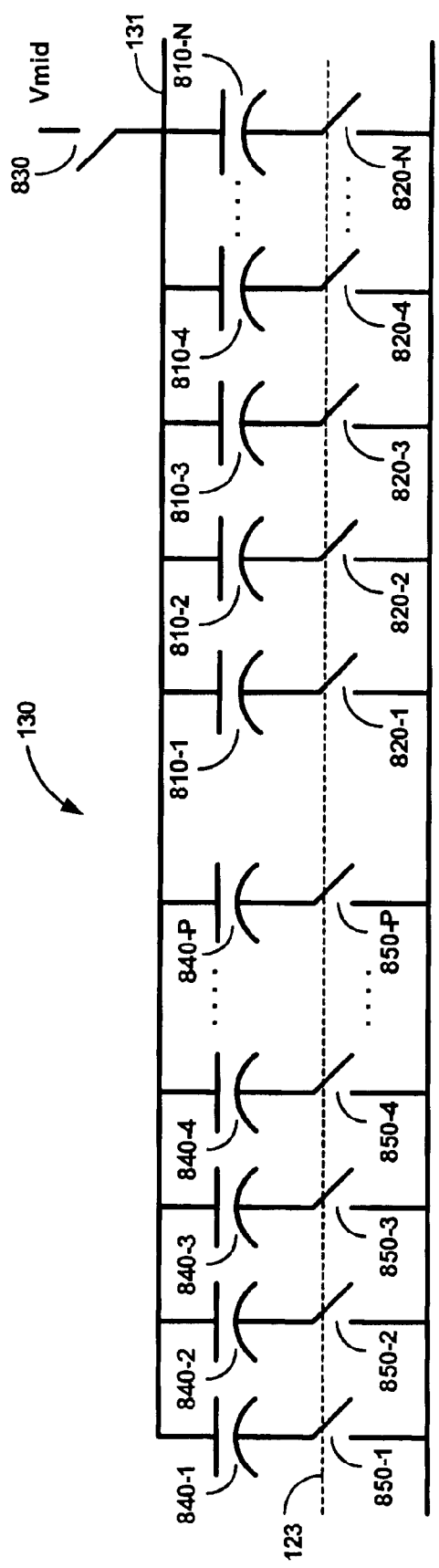
FIG. 8 is a circuit diagram illustrating the details of a capacitor DAC according to an aspect of the present invention.

FIG. 8 is a circuit diagram illustrating the details of a capacitor DAC according to an aspect of the present invention. For illustration, the capacitor DAC is described with reference to FIGS. 1, 2A and 2B. Capacitor DAC 130 is shown containing capacitors 810-1 through 810-N, and 840-1 through 840-P, and switches 820-1 through 820-N, 830, and 850-1 through 850-P. 'P' indicates the number of additional bits or capacitors used in the DAC. The operation of each component is described in further detail below.

Capacitors 810-1 through 810-N, and the corresponding switches 820-1 through 820-N and 830 may be operated similar to capacitors 210-1 through 210-N, and the corresponding switches 220-1 through 220-N and 230 respectively as in FIGS. 2A and 2B to determine a N-bit digital code. The difference voltage $V_{diff}$ (as shown in equation (6)) after determining the N-bit digital code, varies at various time points due to the varying nature of the various noises. The difference voltage represents the error in the bits of N-bit digital code. 'P' additional capacitors/bits are used to sample the difference voltage in the range of $-2^{P-1}*V_{ref}/2^N$ to $2^{P-1}*V_{ref}/2^N$ as described below.

Capacitors 840-1 through 840-P are respectively connected in series to switches 850-1 through 850-P. The series combinations of a capacitor and a switch are connected in parallel, which are in turn connected in parallel to the respective series combinations of capacitors 810-1 through 810-N and switches 820-1 through 820-N. All the switches are shown controlled by an intermediate digital value (both N-bit and P-bit) received on path 123. The intermediate N-bit digital value controls switches 820-1 through 820-N and the intermediate P-bit digital value controls switches 850-1 through 850-P. The top plates of all the capacitors are shown connected to path 131 on which an intermediate analog signal corresponding to the intermediate N-bit digital value and the intermediate P-bit digital value is provided as described below.

Capacitors 840-1 through 840-P may be designed with respective capacitances equaling C, 2C, 4C, through $2^{P-1}C$. Due to the connections, the P capacitors add a voltage to Vtop generated on path 131, and equation (5) may be modified as below:

$$V_{top} = V_{mid} - V_{inp} + \sum_{i=1}^{N} b_i \frac{V_{ref}}{2^i} + \sum_{j=1}^{P} b_j \frac{V_{ref}}{2^j} \quad \text{Equation (12)}$$

wherein the bits $b_j$ together form the intermediate P-bit digital value (which is generated by the SAR logic). Vdiff of Equation (6) is accordingly modified as follows:

$$V_{diff} = V_{inp} - \sum_{i=1}^{N} b_i \frac{V_{ref}}{2^i} - \sum_{j=1}^{P} b_j \frac{V_{ref}}{2^j} \quad \text{Equation (13)}$$

SAR logic 120 may be designed to convert the difference voltage $V_{diff}$ to the P-bit digital value, again by successive approximation principle by interfacing with comparator 110 and DAC 130. Thus, after determining the N-bit digital code, SAR logic 120 approximates each bit in the P-bit digital code and provides the result as the intermediate P-bit digital value on path 123 in each iteration. SAR logic 120 determines the corresponding bit in the P-bit digital code based on the comparison result. All the bits in the P-bit digital code are determined in P-iterations, wherein P is less than N.

It may be noted that capacitor DAC 130 can also be used to determine either 1, 2, 3 . . . or P-1 bit codes as desired by operating only the corresponding switches. For example, a 3-bit code may be determined by operating the switches corresponding to capacitors having capacitances of C, 2C, and 4C only.

It may be further appreciated that the noise may be reduced by averaging Q number of the P-bit digital codes and the average is added to N-bit digital code to determine the accurate output N-bit digital code corresponding to the sample of the analog signal. The manner in which the average of the multiple P-bit codes may be determined is described below with reference to FIG. 9.

9. Averaging Block

Figure 9:
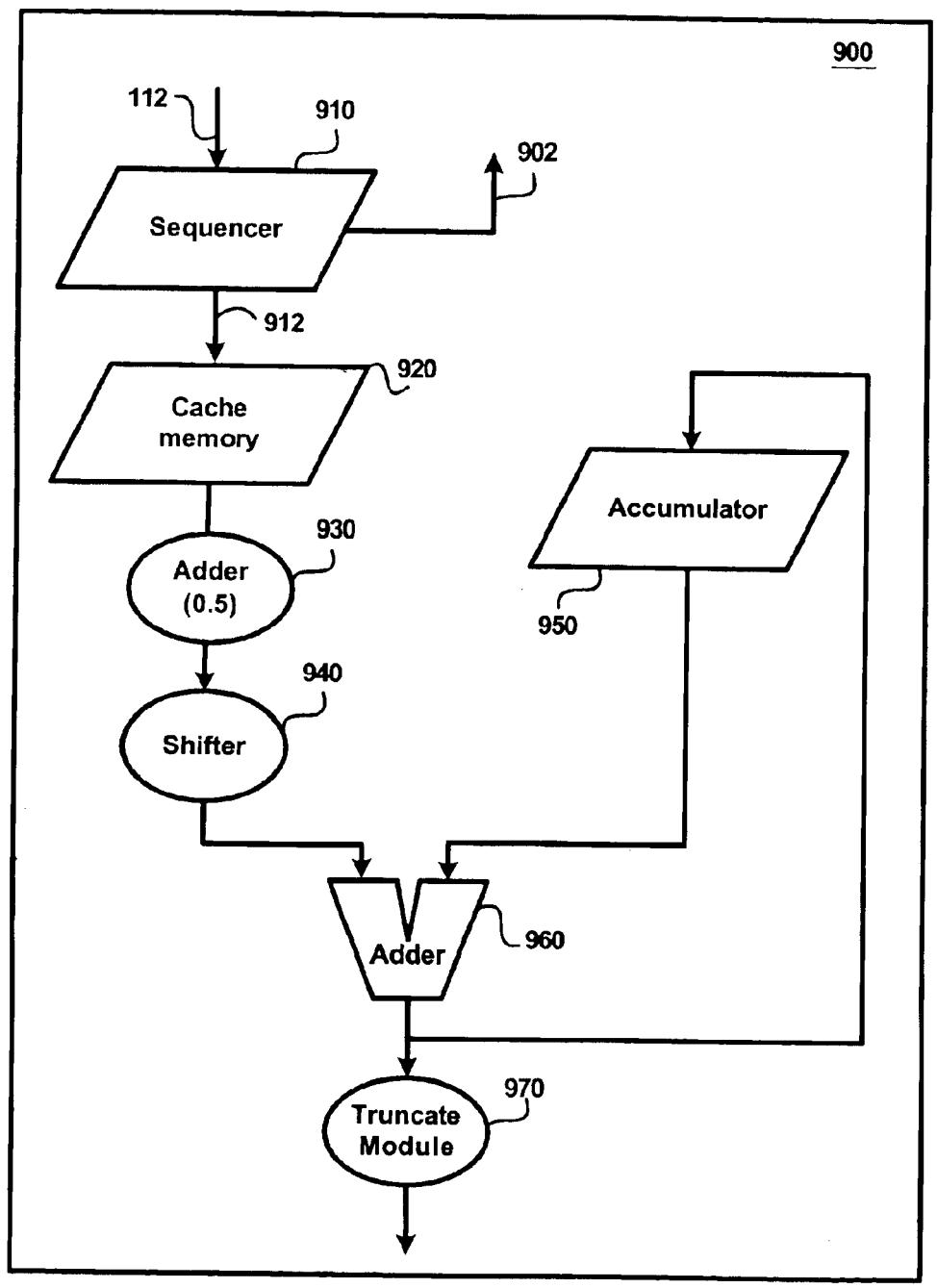
FIG. 9 is a block diagram illustrating the details of a circuit which averages multiple codes in an embodiment of the present invention.

FIG. 9 is a block diagram illustrating the multiple P-bit codes are averaged in an embodiment of the present invention. Averaging block 900 is shown containing sequencer 910, cache memory 920, adders 930 and 960, shifter 940, accumulator 950, and truncate module 970. Averaging block 900 may be implemented within SAR logic 120. Each component of averaging block 900 is described in detail below.

Sequencer 910 determines each-bit in multiple P-bit code based on the comparator output received on path 112 using successive approximation principle (SAP). Sequencer 910 provides on path 902 (contained in path 123) the intermediate P-bit code while determining each bit in the P-bit code to DAC 130. Once determined, each P-bit code is provided on path 912 before beginning the determination of the next P-bit code.

Cache memory 920 stores each of the P-bit codes received on path 912 for further processing. Cache memory 920 enables sequencer 910 to determine the next p-bit code while the other components 930 to 970 operate to add the determined P-bit code (stored in cache memory 920) to any previously determined P-bit codes.

Adder 930 adds a value of 0.5 to each of the P-bit codes. In combination with the operation of truncate module 970, such addition enables the result of the division to be rounded off to the nearest integer. Shifter 940 right shifts each number by $Log_2 Q$ bits to achieve a division of each P-bit code by Q. Accordingly, it may be desirable to select Q as a power of 2 (i.e., 2, 4, 8, 16, etc.).

The loop of accumulator 950 and adder 960 operate to cumulative result of (each P-bit code divided by Q). Accordingly, accumulator 950 may be reset to zero before adding the first P-bit code. Truncate module 970 truncates the fraction part of the cumulative result to generate the correction factor for the N-bit number. The correction factor may then be added to the N-bit number to generate the accurate digital code.

From the above, SAR ADC initially converts the sample of an analog signal into corresponding N-bit digital code. The difference voltage $V_{diff}$ (present after generating the N-bit digital code) is sampled and the corresponding digital code is provided as P-bit code. Multiple P-bit codes are determined to account for randomness in noise. The block diagram in FIG. 9 may average the multiple P-bit codes to reduce the noise and the averaged value is added (adder not shown) to the N-bit digital code to determine the accurate output digital code with high SNR and improved throughput performance.

One problem with the approaches described above is that the correction ends up being a positive number always. However, a negative correction may also be desirable. The manner in which such positive and negative correction can be achieved is described below in further detail.

10. Negative and Positive Correction

According to an aspect of the present invention, sequencer 910 (or SAR logic 120 in general) provides a P-bit code of 1000 . . . 0 (i.e., 1 in the most significant bit (MSB) only) during the sampling phase (described generally with reference to FIG. 2A above). Thus, with reference to FIG. 8, in the sampling phase, capacitors 810-1 through 810-N are connected to the input sample, capacitors 840-1 through 840-(P-1) are connected to ground, and capacitor 840-P is connected to Vref.

As capacitor 840-P remains connected to Vref while the first N-bits are being determined, the first N-bit output is identical to the N-bits that would have been determined in the absence of the P-bit DAC. However, when the P-bits are generated later, 840-P is no longer connected to Vref, which decreases the voltage provided by DAC 130. Each of the P-bits may be determined according to SAP, and an average of the P-bit code may be generated as described above.

Once the averaging is complete, the MSB of the average value is examined. If the MSB is a 1, the value represented by (P-1) bits is added to the N-bit value to generate an accurate output digital code. If the MSB is a 0, the value represented by (P-1) bits is subtracted from the N-bit value. Subtraction may be implemented by generating a 2's complement (in N-bit form) of the (P-1) bits, and adding the 2's complement form to the N-bit value (digital code).

It can be mathematically shown that such an approach provides an effective total correction in the range of $(-2^{P-1}$ to $(2^{P-1}-1))$ (due to the decrease in the DAC voltage after generating the N-bit). Accordingly, both positive and negative corrections may be attained according to an aspect of the present invention. The approaches described above can be implemented in various systems. The description is continued with reference to an example system in which various aspects of the present invention can be implemented.

11. Example System

Figure 10:
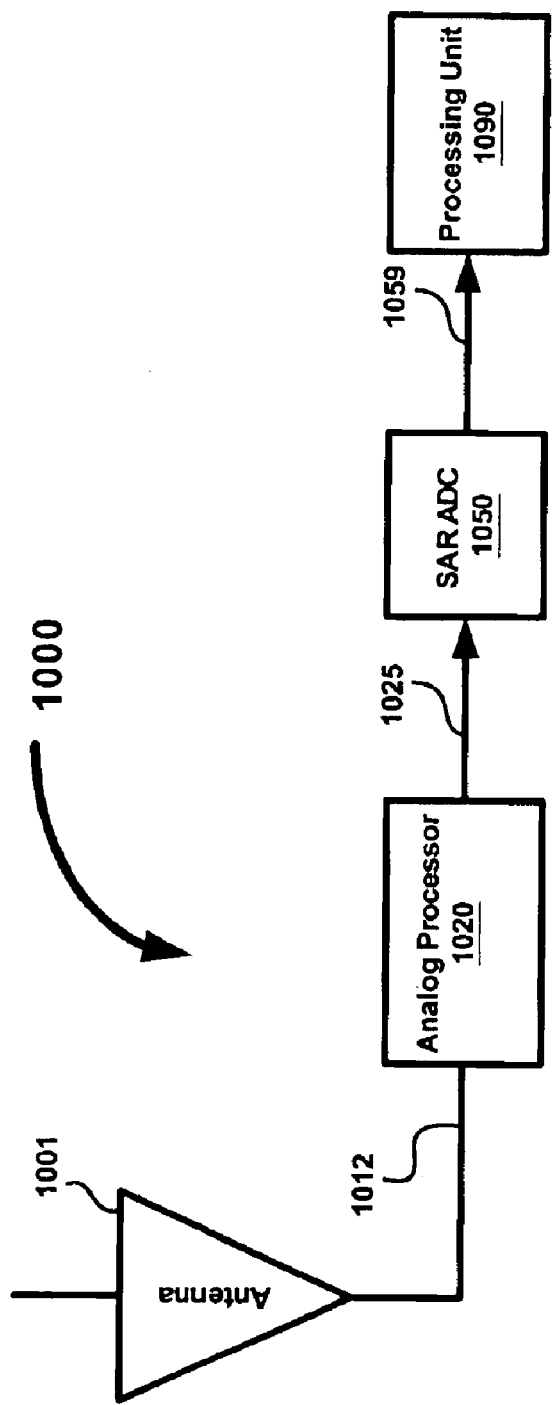
FIG. 10 is a block diagram illustrating an example system in which the present invention can be implemented.

FIG. 10 is a block diagram of receiver system 1000 illustrating an example system in which the present invention may be implemented. For illustration, it is assumed that receiver system 1000 corresponds to a Global Positioning System (GPS) Receiver. However, aspects of the present invention can be implemented in other communication systems (e.g., mobile phone, etc.). Receiver system 1000 is shown containing antenna 1001, analog processor 1020, ADC 1050, and processing unit 1090. Each component is described in further detail below.

Antenna 1001 may receive various signals transmitted from satellites, etc. The received signals may be provided to analog processor 1020 on path 1012 for further processing. Analog processor 1020 may perform tasks such as amplification (or attenuation as desired), filtering, frequency conversion, etc., on received signals and provides the resulting signal on path 1025. The processed signal may be provided to ADC 1050 on path 1025.

ADC 1050 converts the analog signal received on path 1025 to a corresponding digital value based on SAP. The digital value may be provided to processing unit 1090 on path 1059 for further processing. ADC 1050 may be implemented in a similar manner to ADC 100 of FIG. 1. Processing unit 1090 receives the recovered data to provide various user applications (such as telephone calls, data applications).

Thus, various aspects of the present invention described above can be used to provide a successive approximation type analog to digital converters with high signal to noise ratio while increasing the throughput performance.

In addition, various modifications can be made to the embodiments/approaches described above without departing from the scope and spirit of various aspects of the present invention. For example, the DACs are shown implemented using capacitors, however, the DACs can be implemented in several other ways as is well known in relevant arts.

Similarly, even though the description of above is provided with reference to single-ended circuits, the approaches described above can be extended to differential circuits, as will be apparent to one skilled in the relevant arts by reading the disclosure provided herein. Furthermore, the approaches of above can be implemented with reference to other types of noises even though the embodiments are described with reference to Guassian noise. Such embodiments are contemplated to be covered by various aspects of the present invention.

12. Conclusion

While various embodiments of the present invention have been described above, it should be understood that they have been presented by way of example only, and not limitation. Thus, the breadth and scope of the present invention should not be limited by any of the above described exemplary embodiments, but should be defined only in accordance with the following claims and their equivalents.

What is claimed is:

1. A method of converting an analog signal to accurate output digital codes of N-bits each, said method being performed in an analog to digital converter (ADC), said method comprising:

receiving said analog signal;

converting a sample of said analog signal into a N-bit digital code;

generating a difference voltage of said sample and a voltage level represented by said N-bit digital code;

converting said difference voltage into a P-bit digital code, wherein P is less than N; and determining an accurate output digital code from said N-bit digital code and said P-bit digital code.

2. The method of claim 1, further comprising:

generating said difference voltage at a plurality of time points;

performing said converting said difference voltage a corresponding number of times to generate a corresponding plurality of P-bit digital codes;

determining an average of said plurality of P-bit digital codes; and performing an addition operation based on said average and said N-bit digital code to generate said accurate output digital code.

3. The method of claim 2, wherein said difference voltage changes due to internal noise in said ADC and said addition operation reduces the effect of said internal noise in the value generated for said accurate output digital code.

4. The method of claim 3, wherein said P is substantially smaller than said N, and equals an integer not less than $[\log_2(6*\sigma tot)]$, wherein * represents a multiplication operation, and $\Phi tot$ represents a total of said internal noise.

5. The method of claim 2, wherein said addition operation corrects said N-bit digital code in either positive direction or negative direction according to said P-bit digital code.

6. A method of converting an analog signal to accurate output digital codes of N-bits each, said method being performed in an analog to digital converter (ADC), said method comprising:

receiving said analog signal;

converting a sample of said analog signal into a N-bit digital code;

generating a difference voltage of said sample and a voltage level represented by said N-bit digital code;

converting said difference voltage into a P-bit digital code, wherein P is less than N; and determining an accurate output digital code from said N-bit digital code and said P-bit digital code, wherein said ADC comprises N first set of capacitors and P second set of capacitors, wherein said first set of capacitors are operated according to successive approximation principle (SAP) to determine said N bit digital code, and said second set of capacitors are thereafter operated according to said SAP to determine said P-bit digital code, said method further comprising:

sampling said sample on said first set of capacitors in a sampling phase, wherein said sampling is performed before converting said sample into said N-bit digital code;

connecting a first capacitor contained in said second set of capacitors to a Vref voltage and the remaining ones of said second set of capacitors to ground in said sampling phase, wherein said first capacitor corresponds to a most significant bit (MSB) of said P-bit digital code;

adding all but the MSB of said P-bit digital code to said N-bit digital code if the MSB of said P-bit digital code is of one logical value; and subtracting all but the MSB of said P-bit digital code from said N-bit digital code if the MSB of said P-bit digital code is of the other logical value.

7. A successive approximation type analog to digital converter (SAR ADC) converting a sample of an input analog signal into an accurate N-bit digital code, said SAR ADC comprising:

a comparator providing a comparison result of a first analog signal and said sample;

a digital to analog converter (DAC) receiving an intermediate N-bit value and an intermediate P-bit value, said DAC generating said first analog signal based on said intermediate N-bit value and said intermediate P-bit value; and a SAR logic determining a first N-bit digital code according to successive approximation principle (SAP) by sending said intermediate N-bit value in each of N iterations, said SAR logic then generating a first P-bit digital code according to said SAP by sending said intermediate P-bit value in each of P iterations, wherein said first N-bit digital code is corrected using said first P-bit digital code to generate said accurate N-bit digital code wherein P is less than N.

8. A successive approximation type analog to digital converter (SAR ADC) converting a sample of an input analog signal into an accurate N-bit digital code, said SAR ADC comprising:

a comparator providing a comparison result of a first analog signal and said sample;

a digital to analog converter (DAC) receiving an intermediate N-bit value and an intermediate P-bit value, said DAC generating said first analog signal based on said intermediate N-bit value and said intermediate P-bit value; and a SAR logic determining a first N-bit digital code according to successive approximation principle (SAP) by sending said intermediate N-bit value in each of N iterations, said SAR logic then generating a first P-bit digital code according to said SAP by sending said intermediate P-bit value in each of P iterations, wherein said first N-bit digital code is corrected using said first P-bit digital code to generate said accurate N-bit digital code, wherein said SAR logic determines a plurality of P-bit digital codes including said first P-bit digital code, said plurality of P-bit digital codes being averaged to generate an average value, wherein said first N-bit digital code is corrected using said average value.

9. The SAR ADC of claim 8, wherein said DAC comprises:

N first set of capacitors, each having a capacitance value corresponding to a weight of a corresponding one of a N-bit code;

N first set of switches, wherein each of said first set of switches connects a corresponding one of said first set of capacitors to said sample in a sampling phase of said SAP, each of said first set of switches connecting a corresponding one of said first set of capacitors to a ground or a reference voltage according to a corresponding bit of said intermediate N-bit value in a conversion phase of said SAP;

P second set of capacitors, each having a capacitance value corresponding to a weight of a corresponding one of a P-bit code, wherein P is less than N; and P second set of switches, each of said second set of switches connecting a corresponding one of said second set of capacitors to a ground or a reference voltage according to a corresponding bit of said intermediate P-bit value.

10. The SAR ADC of claim 9, wherein another end of each of said first set of capacitors and said second set of capacitors is connected to a $V_{mid}$ voltage by a third switch, wherein said third switch is in a closed state in said sampling phase and in an open state in said conversion phase, wherein an intermediate analog signal equaling the following voltage is generated by said DAC:

$$V_{top} = V_{mid} - V_{inp} + \sum_{i=1}^{N} b_i \frac{V_{ref}}{2^i} + \sum_{j=1}^{P} b_j \frac{V_{ref}}{2^j}$$

wherein $V_{ref}$ and $V_{inp}$ represent said reference voltage and voltage of said sample, and $b_i$ represents the $i^{th}$ bit of said intermediate N-bit value and $b_j$ represents the $j^{th}$ bit of said intermediate P-bit value.

11. The SAR ADC of claim 10, wherein said comparator compares said intermediate analog signal with said $V_{mid}$ voltage to generate said comparison result.

12. The SAR ADC of claim 11, wherein said average value is used to correct said first N-bit digital code in either positive or negative direction.

13. The SAR ADC of claim 12, wherein SAR logic sets a most significant bit (MSB) of said P-bit digital code to one in said sampling phase, and adds all but the MSB of said average value to said N-bit digital code if the MSB of said average value is of one logical value, said SAR logic subtracting all but the MSB of said average value from said N-bit digital code if the MSB of said P-bit digital code is of the other logical value.

14. The SAR ADC of claim 13, wherein said DAC comprises more than P of said second set of switches, and wherein P is determined by a noise introduced internally in said SAR ADC.

15. The SAR ADC of claim 13, wherein said noise comprises components introduced by said DAC and said comparator.

16. A successive approximation type analog to digital converter (SAR ADC) converting an analog signal to accurate output digital codes of N-bits each, said SAR ADC comprising:
means for receiving said analog signal;
means for converting a sample of said analog signal into a N-bit digital code;
means for generating a difference voltage of said sample and a voltage level represented by said N-bit digital code;
means for converting said difference voltage into a P-bit digital code, wherein P is less than N; and
means for determining an accurate output digital code from said N-bit digital code and said P-bit digital code.

17. The SAR ADC of claim 16, further comprising:
means for generating said difference voltage at a plurality of time points, wherein said means for converting said difference voltage converts said difference voltage a corresponding number of times to generate a corresponding plurality of P-bit digital codes;
means for determining an average of said plurality of P-bit digital codes; and
means for performing an addition operation based on said average and said N-bit digital code to generate said accurate output digital code.

18. The SAR ADC of claim 17, wherein said difference voltage changes due to internal noise in said SAR ADC and said addition operation reduces the effect of said internal noise in the value generated for said accurate output digital code.

19. A successive approximation type analog to digital converter (SAR ADC) converting an analog signal to accurate output digital codes of N-bits each, said SAR ADC comprising:
means for receiving said analog signal;
means for converting a sample of said analog signal into a N-bit digital code;
means for generating a difference voltage of said sample and a voltage level represented by said N-bit digital code;
means for converting said difference voltage into a bit digital code, wherein P is less than N; and
means for determining an accurate output digital code from said N-bit digital code and said P-bit digital code,
wherein said P is substantially smaller than said N, and equals an integer not less than [$\log_2 (6*\sigma tot)$], wherein * represents a multiplication operation, and $\Phi tot$ represents a total of said internal noise.

20. A successive approximation type analog to digital converter (SAR ADC) converting an analog signal to accurate output digital codes of N-bits each, said SAR ADC comprising:
means for receiving said analog signal;
means for converting a sample of said analog signal into a N-bit digital code;
means for generating a difference voltage of said sample and a voltage level represented by said N-bit digital code;
means for converting said difference voltage into a P-bit digital code, wherein P is less than N;
means for determining an accurate output digital code from said N-bit digital code and said P-bit digital code,
means for generating said difference voltage at a plurality of time points, wherein said means for converting said difference voltage converts said difference voltage a corresponding number of times to generate a corresponding plurality of P-bit digital codes;
means for determining an average of said plurality of P-bit digital codes; and
means for performing an addition operation based on said average and said N-bit digital code to generate said accurate output digital code,
wherein said addition operation corrects said N-bit digital code in either positive direction or negative direction according to said P-bit digital code.

21. The SAR ADC of claim 20, wherein said means for converting a sample comprises N first set of capacitors and P second set of capacitors, wherein said first set of capacitors are operated according to successive approximation principle (SAP) to determine said N bit digital code, and said second set of capacitors are thereafter operated according to said SAP to determine said P-bit digital code, said SAR ADC further comprising:
means for sampling said sample on said first set of capacitors in a sampling phase, wherein said means for sampling is performed before converting said sample into said N-bit digital code;
means for connecting a first capacitor contained in said second set of capacitors to a Vref voltage and the remaining ones of said second set of capacitors to ground in said sampling phase, wherein said first capacitor corresponds to a most significant bit (MSB) of said P-bit digital code;
means for adding all but the MSB of said P-bit digital code to said N-bit digital code if the MSB of said P-bit digital code is of one logical value; and
means for subtracting all but the MSB of said P-bit digital code from said N-bit digital code if the MSB of said P-bit digital code is of the other logical value.

22. A system comprising:
an analog processor processing an analog signal to generate an analog sample;
a successive approximation type analog to digital converter (SAR ADC) converting said analog sample into an accurate N-bit digital code, said SAR ADC comprising:
a comparator providing a comparison result of a first analog signal and said sample;
a digital to analog converter (DAC) receiving an intermediate N-bit value and an intermediate P-bit value, said DAC generating said first analog signal based on said intermediate N-bit value and said intermediate P-bit value; and
a SAR logic determining a first N-bit digital code according to successive approximation principle (SAP) by sending said intermediate N-bit value in each of N iterations, said SAR logic then generating a first P-bit digital code according to said SAP by sending said intermediate P-bit value in each of P iterations, wherein said first N-bit digital code is corrected using said first P-bit digital code to generate said accurate N-bit digital code; and
a processing unit receiving said accurate output digital code wherein P is less than N.

23. The system of claim 22, wherein said SAR logic determines a plurality of P-bit digital codes including said first P-bit digital code, said plurality of P-bit digital codes being averaged to generate an average value, wherein said first N-bit digital code is corrected using said average value.

24. A system comprising:
an analog processor processing an analog signal to generate an analog sample;
a successive approximation type analog to digital converter (SAR ADC) converting said analog sample into an accurate N-bit digital code, said SAR ADC comprising:
a comparator providing a comparison result of a first analog signal and said sample;
a digital to analog converter (DAC) receiving an intermediate N-bit value and an intermediate P-bit value, said DAC generating said first analog signal based on said intermediate N-bit value and said intermediate P-bit value; and
a SAR logic determining a first N-bit digital code according to successive approximation principle (SAP) by sending said intermediate N-bit value in each of N iterations, said SAR logic then generating a first P-bit digital code according to said SAP by sending said intermediate P-bit value in each of P iterations, wherein said first N-bit digital code is corrected using said first P-bit digital code to generate said accurate N-bit digital codes; and
a processing unit receiving said accurate output digital code,
wherein said DAC comprises:
N first set of capacitors, each having a capacitance value corresponding to a weight of a corresponding one of a N-bit code;
N first set of switches, wherein each of said first set of switches connects a corresponding one of said first set of capacitors to said sample in a sampling phase of said SAP, each of said first set of switches connecting a corresponding one of said first set of capacitors to a ground or a reference voltage according to a corresponding bit of said intermediate N-bit value in a conversion phase of said SAP;
P second set of capacitors, each having a capacitance value corresponding to a weight of a corresponding one of a P-bit code, wherein P is less than N; and
P second set of switches, each of said second set of switches connecting a corresponding one of said second set of capacitors to a ground or a reference voltage according to a corresponding bit of said intermediate P-bit value.

25. The system of claim 24, wherein another end of each of said first set of capacitors and said second set of capacitors is connected to a $V_{mid}$ voltage by a third switch, wherein said third switch is in a closed state in said sampling phase and in an open state in said conversion phase, wherein an intermediate analog signal equaling the following voltage is generated by said DAC:

$$V_{top} = V_{mid} - V_{inp} + \sum_{i=1}^{N} b_i \frac{V_{ref}}{2^i} + \sum_{j=1}^{P} b_j \frac{V_{ref}}{2^i}$$

wherein $V_{ref}$ and $V_{inp}$ represent said reference voltage and voltage of said sample, and $b_i$ represents the $i^{th}$ bit of said intermediate N-bit value and $b_j$ represents the $j^{th}$ bit of said intermediate P-bit value.

26. The system of claim 25, wherein said comparator compares said intermediate analog signal with said $V_{mid}$ voltage to generate said comparison result.

27. The system of claim 26, wherein said average value is used to correct said first N-bit digital code in either positive or negative direction.

28. The system of claim 27, wherein SAR logic sets a most significant bit (MSB) of said P-bit digital code to one in said sampling phase, and adds all but the MSB of said average value to said N-bit digital code if the MSB of said average value is of one logical value, said SAR logic subtracting all but the MSB of said average value from said N-bit digital code if the MSB of said P-bit digital code is of the other logical value.

29. The system of claim 28, wherein said DAC comprises more than P of said second set of switches, and wherein P is determined by a noise introduced internally in said SAR ADC.

30. The system of claim 28, wherein said noise comprises components introduced by said DAC and said comparator.

31. The system of claim 30, wherein said system comprises a global positioning system receiver, said system further comprising an antenna to recieve said analog signal and provide to said analog processor.

* * * * *